(12) United States Patent
Rajendran et al.

(10) Patent No.: US 8,963,313 B2
(45) Date of Patent: Feb. 24, 2015

(54) HETEROGENEOUS CHIP INTEGRATION WITH LOW LOSS INTERCONNECTION THROUGH ADAPTIVE PATTERNING

(75) Inventors: Sankerlingam Rajendran, Plano, TX (US); Monte R. Sanchez, Murphy, TX (US); Susan M. Eshelman, Plano, TX (US); Douglas R. Gentry, Plano, TX (US); Thomas A. Hanft, Allen, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/334,650

(22) Filed: Dec. 22, 2011

(65) Prior Publication Data

US 2013/0161782 A1 Jun. 27, 2013

(51) Int. Cl.
*H01L 23/22* (2006.01)
*H01L 23/24* (2006.01)
*H01L 23/14* (2006.01)
*H01L 23/043* (2006.01)

(52) U.S. Cl.
CPC ............ *H01L 23/142* (2013.01); *H01L 23/043* (2013.01); *Y10S 438/975* (2013.01)
USPC ........... 257/687; 257/678; 257/706; 257/797; 257/E23.004; 257/E23.005; 257/E23.006; 257/E23.068; 257/E23.079; 257/E23.128; 257/E23.179; 438/122; 438/975

(58) Field of Classification Search
CPC ... H01L 23/043; H01L 23/047; H01L 23/142; H01L 23/4821
USPC ........... 257/E23.128, 797, E23.179, E23.063, 257/728, 690, 712, 684, 687, 706, E23.004, 257/E23.005, E23.006, E23.079, 678; 438/975, 401, 122

See application file for complete search history.

(56) References Cited

U.S. PATENT DOCUMENTS

| | | | |
|---|---|---|---|
| 6,218,214 B1 * | 4/2001 | Panchou et al. | 438/108 |
| 6,483,406 B1 * | 11/2002 | Sawa et al. | 333/247 |
| 2002/0140071 A1 * | 10/2002 | Leighton et al. | 257/678 |
| 2004/0178462 A1 * | 9/2004 | Sakaguchi et al. | 257/432 |
| 2005/0272182 A1 * | 12/2005 | Smith | 438/106 |
| 2006/0145328 A1 | 7/2006 | Hsu | |
| 2006/0172458 A1 | 8/2006 | Droz | |
| 2007/0095471 A1 | 5/2007 | Ito et al. | |

(Continued)

FOREIGN PATENT DOCUMENTS

| | | |
|---|---|---|
| JP | H11233678 A | 8/1999 |
| JP | 2001332863 A | 11/2001 |

(Continued)

*Primary Examiner* — Kimberly Rizkallah
*Assistant Examiner* — Maria Ligai
(74) *Attorney, Agent, or Firm* — Burns & Levinson LLP; Joseph M. Maraia

(57) ABSTRACT

Integrating a semiconductor component with a substrate through a low loss interconnection formed through adaptive patterning includes forming a cavity in the substrate, placing the semiconductor component therein, filling a gap between the semiconductor component and substrate with a fill of same or similar dielectric constant as that of the substrate and adaptively patterning a low loss interconnection on the fill and extending between the contacts of the semiconductor component and the electrical traces on the substrate. The contacts and leads are located and adjoined using an adaptive patterning technique that places and forms a low loss radio frequency transmission line that compensates for any misalignment between the semiconductor component contacts and the substrate leads.

39 Claims, 3 Drawing Sheets

(56) References Cited

U.S. PATENT DOCUMENTS

2007/0210458 A1 9/2007 Hagio
2009/0242252 A1 10/2009 Tanaka
2009/0267235 A1 10/2009 Mason et al.

FOREIGN PATENT DOCUMENTS

JP 2002141636 A 5/2002
JP 2007214402 A 8/2007

* cited by examiner

HETEROGENEOUS CHIP INTEGRATION WITH LOW LOSS INTERCONNECTION THROUGH ADAPTIVE PATTERNING

FIELD OF THE INVENTION

The currently described invention relates to systems and methods for integrating semiconductor components, including active and passive devices, with a substrate.

BACKGROUND

Semiconductor integration methods typically involve connecting active and/or passive elements with passive circuitry via wire or ribbon bonds or flip chip bumps that manifest parasitic behavior at higher frequencies (i.e., at or greater than 10 GHz). In these integration methods, discontinuities in RF (radio frequency) transmission lines are caused by discontinuities in dielectric properties of underlying material and air gaps between bridged materials (e.g., discontinuity between the dielectric of a substrate material to air). The ribbon bond, flip chip technique compromises performance in high radio frequency applications. Additionally, placement inaccuracies between a semiconductor component and a substrate are typically overcome by increasing landing pad dimensions, which results in a substantial increase in radio frequency signal loss at the transition between the semiconductor component and the substrate. These placement inaccuracies also result in requiring a greater pitch between components on the substrate, and increased size and associated cost of the substrate and components.

A need therefore exists for improved methods and systems for integrating semiconductor components with a substrate that compensates for placement inaccuracies without causing performance degradation at high radio frequencies, increased pitch between components, or an increase in component size.

SUMMARY

One embodiment is a method for integrating a semiconductor component with a layered substrate. The method includes forming a cavity in a layered substrate. The layered substrate includes a first layer disposed over a second layer of the layered substrate such that the second layer defines the cavity bottom. The method also includes disposing a semiconductor component in the cavity such that a top surface of an electrical contact on the semiconductor component is substantially coplanar with the top surface of an electrical trace on the first layer of the layered substrate. The method also includes locating at least one fixed fiducial on the first layer. The method also includes locating at least one fixed fiducial on the semiconductor component. The method also includes forming an electrical interconnect between the electrical trace on the first layer and the electrical contact on the semiconductor component based on the relative positions of the at least one fixed fiducial on the first layer and the at least one fixed fiducial on the semiconductor component, wherein the position of the electrical trace on the first layer is fixed relative to the at least one fixed fiducial on the first layer and the position of the electrical contact on the semiconductor component is fixed relative to the at least one fixed fiducial on the semiconductor component.

In some embodiments, the step of forming the cavity includes sizing the cavity such that a gap of 0-40 microns exists between the semiconductor component and walls of the cavity. In some embodiments, a gap of 25-35 microns exists between the semiconductor component and the walls of the cavity. In some embodiments, the method includes filling the gap between the semiconductor and the walls of the cavity with dielectric material such that a top surface of the dielectric material is substantially coplanar with the top surface of the semiconductor component and the top surface of the first layer. In some embodiments, the method optionally includes applying an adhesive between the cavity bottom and the semiconductor component. In some embodiments, the method optionally includes applying a solder between the cavity bottom and the semiconductor component. In some embodiments, the method includes disposing the semiconductor component in the cavity such that the electrical contact on the top surface of the semiconductor component is substantially aligned with the electrical trace on the first layer of the layered substrate, wherein alignment includes locating the relative positions of the at least one fixed fiducial on the first layer and the at least one fixed fiducial on the semiconductor component.

In some embodiments, the method includes patterning the electrical trace to compensate for variation in interconnect length between one or more contacts on the semiconductor component and one or more corresponding electrical traces. In one embodiment, the method includes at least one of stretching, compressing, translating or rotating the electrical trace pattern to accommodate for variation in placement of the semiconductor component within the cavity.

In some embodiments, the method includes using a low energy laser to locally develop a photoresist applied to the electrical device, thereby adaptively patterning each individual electrical interconnect extending between one of the one or more contacts and a corresponding one of the one or more electrical traces, thereby accommodating misalignment. In some embodiments, the low energy laser is a 355 nm laser producing 3.5 mw of power at a laser firing frequency of 30 KHz with a linear scan rate of 52 mm/sec and having a laser spot size of 16 microns.

In one embodiment, the method includes forming the electrical interconnect using one of a pen, a stamping process, or a direct write process that direct writes conductors made of gold, silver, or copper.

In some embodiments, the method includes coating a first layer of photoresist across the top surfaces of the first layer and semiconductor component, opening the first layer of photoresist with laser exposure and development along the electrical interconnect pattern. The method includes depositing a conductive seed layer at least along the electrical interconnect pattern opened in the first layer of photoresist, and coating a second layer of photoresist across the top surfaces of the first layer, semiconductor component, and seed layer. The method includes opening the second layer of photoresist with laser exposure and development along the electrical interconnect pattern, electroplating the seed layer along the electrical interconnect pattern and removing the first layer of photoresist, second layer of photoresist, and unplated seed layer disposed therebetween, if present.

In some embodiments, the low energy laser is a 355 nm laser producing 3.5 mw of power at a laser firing frequency of 30 KHz with a linear scan rate of 52 mm/sec and having a laser spot size of 16 microns.

Another embodiment is an electrical device. The electrical device includes a layered substrate comprising a first layer disposed over a second layer of the layered substrate. The electrical device also includes a cavity formed in the layered substrate such that the second layer defines the cavity bottom, and a semiconductor component disposed in the cavity such that a top surface of an electrical contact on the semiconductor component is substantially coplanar with a top surface of an electrical trace on the first layer of the layered substrate. The electrical device also includes an electrical interconnect extending between the electrical trace on the first layer and the electrical contact on the semiconductor component. The path of the electrical interconnect is based on relative positions of at least one fixed fiducial on the first layer and at least one fixed fiducial on the semiconductor component. The position of the electrical trace on the first layer is fixed relative to the at least one fixed fiducial on the first layer, and the position of the electrical contact on the semiconductor component is fixed relative to the at least one fixed fiducial on the semiconductor component.

In some embodiments, the cavity is formed such that a gap of 0-40 microns exists between the semiconductor component and walls of the cavity. In some embodiments, the electrical device includes a fill of dielectric material in the gap between the semiconductor and the walls of the cavity, and the top surface of the dielectric material is substantially coplanar with the top surface of the semiconductor component and the top surface of the first layer. In some embodiments, the semiconductor component is placed in the cavity such that the electrical contact on the top surface of the semiconductor component is substantially aligned with the electrical trace on the first layer of the layered substrate based on the relative positions of the at least one fixed fiducial on the first layer and the at least one fixed fiducial on the semiconductor component.

Other aspects and advantages of the current invention will become apparent from the following detailed description, taken in conjunction with the accompanying drawings, illustrating the principles of the invention by way of example only.

BRIEF DESCRIPTION OF THE DRAWINGS

The foregoing features of various embodiments of the invention will be more readily understood by reference to the following detailed descriptions in the accompanying drawings, in which.

DETAILED DESCRIPTION OF ILLUSTRATIVE EMBODIMENTS

Figure 1:
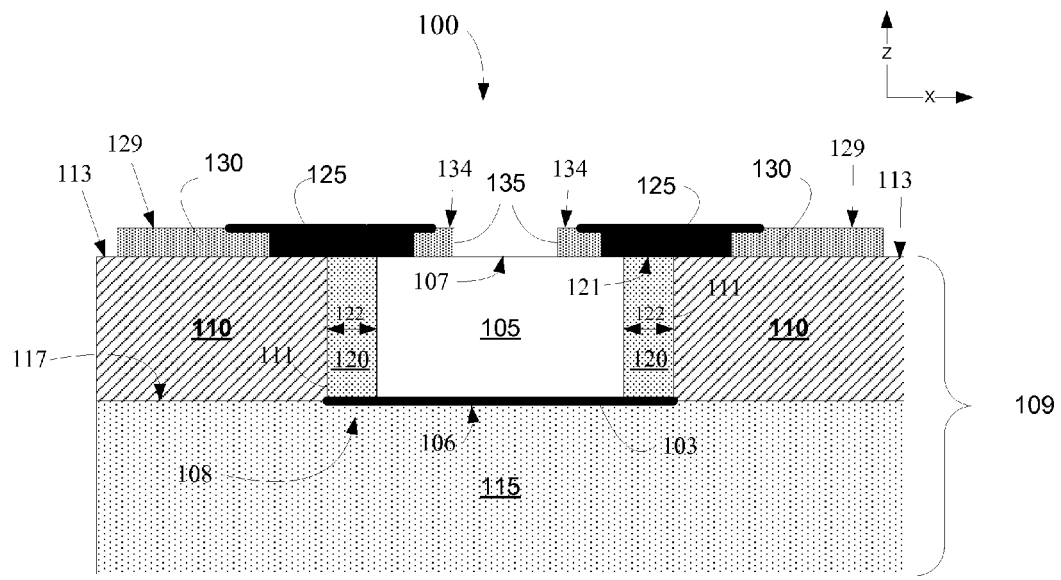
FIG. 1 is a schematic illustration of a side view of an integrated semiconductor component and substrate, according to an illustrative embodiment.
Figure 2:
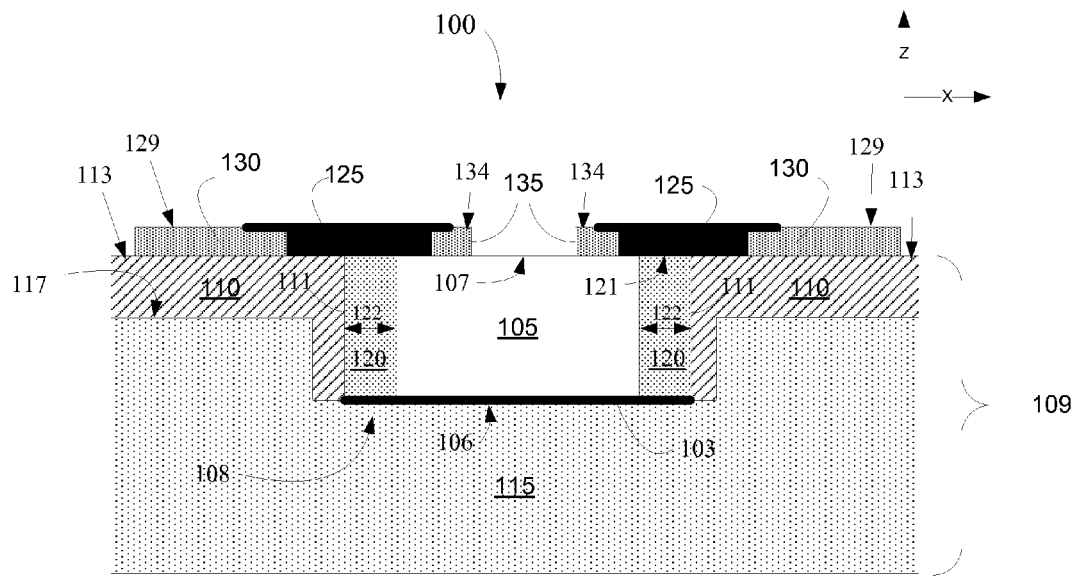
FIG. 2 is a schematic illustration of a side view of an integrated semiconductor component and substrate, according to an alternate illustrative embodiment.
Figure 3:
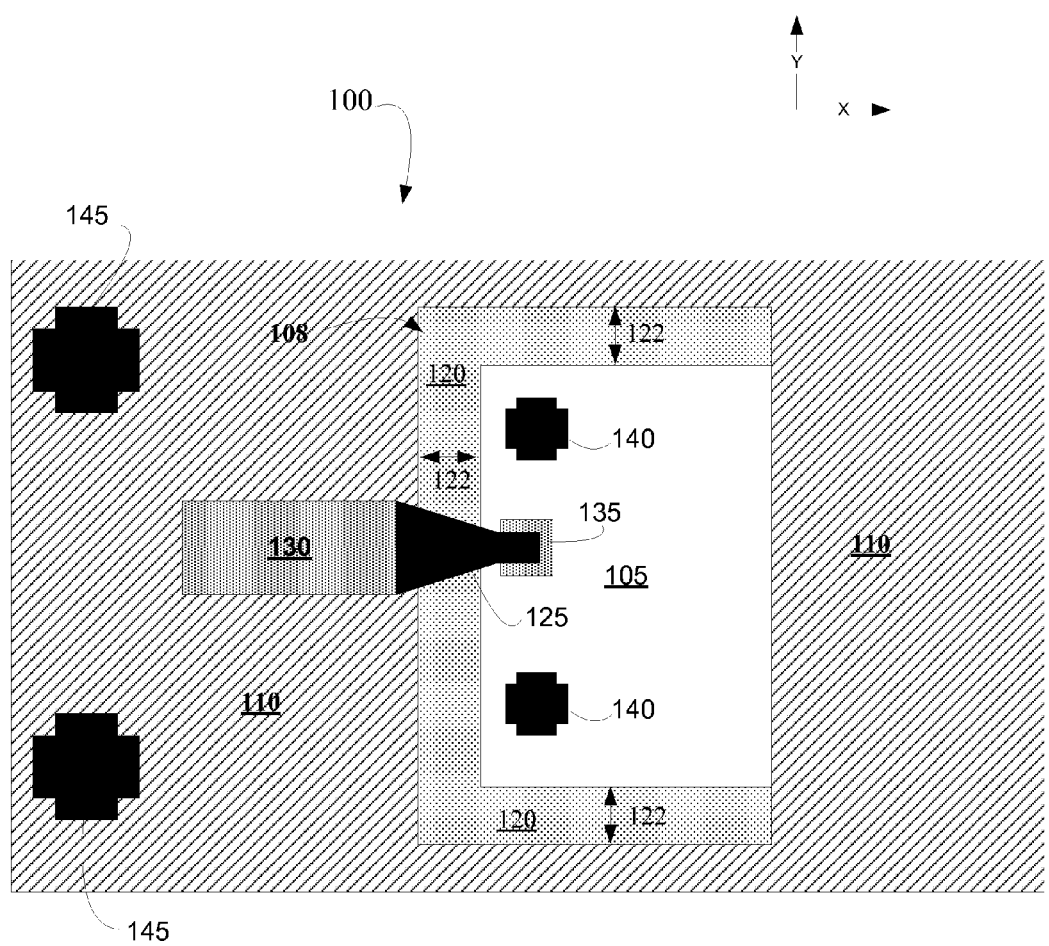
FIG. 3 is a schematic illustration of a top view of an integrated semiconductor component and substrate, according to an illustrative embodiment.

FIGS. 1, 2, and 3 are schematic illustrations of an electrical device 100, according to illustrative embodiments. The electrical device 100 is depicted after integrating the components together as described below with respect to FIG. 4. FIG. 1 is a side view (in the Z-X plane) of the electrical device 100 according to an illustrative embodiment. FIG. 2 is a side view (in the Z-X plane) of the electrical device 100 according to another illustrative embodiment. FIG. 3 is a top view (X-Y plane) of the embodiments of the electrical device 100 of FIGS. 1 and 2. The electrical device 100 includes a semiconductor component 105 disposed in a cavity 108 formed in a layered substrate 109. The layered substrate 109 includes at least a first layer 110 disposed over a second layer 115. Active and passive semiconductor components 105 made of different materials (for example, GaN, GaAs, SiGe and Si), using different device technology (for example, p-HEMT, m-HEMT, SOI, and CMOS) and having different thickness are readily integrated into the layered substrate 109. The semiconductor components 105 include, for example, active and passive components such as high frequency discrete devices field effect transistors (FETs), monolithic microwave integrated circuits (MMICs), switches, attenuators, capacitors, resistors, inductors, and circulators.

In some embodiments, the first layer 110 is a low loss material adapted for fabricating a radio frequency (RF) matching network. For example, the low loss material of the first layer 110 may be one of liquid crystal polymer (LCP) material, benzocyclobutene (BCB), or Teflon®. The material of the first layer 110 has a dielectric constant and material thickness (along the Z-axis) that enables matching the width of the contact 135 on the semiconductor component 105 to the width of the electrical trace 130 on the first layer 110 in order to achieve the desired RF impedance. In one embodiment, the first layer 110 is made of a low loss RF material, such as, for example, 1 mil thick LCP material having a loss tangent of 0.002 and a dielectric constant of 2.9.

Referring to the illustrative embodiments of FIGS. 1 and 2, the electrical device 100 includes one or more cavities 108 of different depths formed in the layered substrate 109 for receiving one or more of the semiconductor components 105. In some embodiments, multiple types of components, active and passive, and multiple cavities are heterogeneously integrated within the same layered substrate. The cavities 108 can be formed by various semiconductor fabrication techniques (e.g., etching or ablation). The depth of the cavity 108 (along the Z-axis) is determined based on thickness (along the Z-axis) of the semiconductor component 105 received therein and such that the top surface 134 of a contact 135 on the semiconductor component 105 is substantially coplanar with the top surface 129 of a trace 130 on the first layer 110 of the layered substrate 109. Aligning the top surface of the contact 135 with the top surface of the trace 130 accounts for any height difference between the contact 135 and network trace 130 and enables proper continuity in an electrical interconnect 125 patterned between the contact 135 and trace 130.

The cavity 108 is formed in the layered substrate 109 such that the second layer 115 defines the cavity bottom 106. Referring to FIG. 1, the top surface 117 of the second layer 115 defines the cavity bottom 106. Alternatively, as depicted in FIG. 2, an intermediate portion of the second layer 115 defines the cavity bottom 106. In one embodiment, the semiconductor component 105 is 0.05 mm (2 mils) thick, the first layer 110 is 0.025mm (1 mil) thick and the cavity 108 extends 0.03 mm (1.2 mils) into the second layer 115. The depth of the cavity 108 therefore accommodates the thickness (along the Z-axis) of the semiconductor component 105 and also thickness (along the Z-axis) of attachment means 103 (e.g. adhesive or solder) disposed between the semiconductor component 105 and the cavity bottom 106 while still enabling coplanarity of the top surface 134 of a contact 135 on the semiconductor component 105 and the top surface 129 of a trace 130 on the first layer 110.

In some embodiments, the second layer 115 is formed from a highly thermally conductive material that forms the thermal plane for heat dissipation from the high power electrical device 105. The second layer 115 also forms a continuous ground plane for the RF signal of the electrical device 105 and the substrate of the first layer 110. The thermally dissipative material may be, for example, one of copper, copper alloys, such as molybdenum-copper and tungsten-copper, AlSiC, AN, or silicon.

With the semiconductor component 105 situated in the cavity 108, an electrical interconnect 125 extends between an electrical trace 130 on the first layer 110 and an electrical contact 135 on the semiconductor component 105. FIG. 1 depicts a relatively thin deposition of the electrical interconnect 125 onto the electrical trace 130 and electrical contact 135. In some embodiments, the electrical interconnect is plated to the same thickness on all surfaces (i.e., on the surfaces of the electrical trace 130, first layer 110, a dielectric material 120, and the electrical contact 135). The electrical interconnect 125 is fabricated to accommodate the variations in placement of the semiconductor component 105 without negatively affecting performance of the electrical interconnect 125, which forms a controlled impedance RF transmission line. Fabrication of the electrical interconnect 125 includes compensating for any misalignment between a contact 135 on the semiconductor component 105 and an electrical trace 130. Fabrication of the electrical interconnect 125 addresses not only the trajectory of the electrical interconnect 125 (i.e. the path the electrical interconnect takes over a surface) but also thickness and width such that the impedance is matched between the contact 135 and electrical trace 130 and RF loss is ultra low (e.g., between 0 dB and 0.05 dB at 100 GHz) at high frequency operation levels.

In some embodiments, the electrical interconnect 125 may be formed, for example, by direct writing techniques for depositing gold, silver, or copper conductors. In some embodiments, the fabrication of the electrical interconnect 125 includes applying a photoresist to the entire top surface of the electrical device 100 and locally developing the photoresist with a low energy laser only in the areas in which each electrical interconnect 125 will be formed. The low energy laser, therefore, adaptively patterns each individual electrical interconnect 125 and accommodates variation in alignment (in the X-Y plane) between the one or more contacts 135 on the semiconductor component 105 and one or more corresponding electrical traces 130 on the first layer 110 of the layered substrate 109. Using a low energy laser exposure prevents material damage that otherwise could result from commonly-used laser ablation techniques. For example, in one embodiment, laser exposure includes a 355 nm laser producing 3.5 mw of power at a laser firing frequency of 30 KHz with a linear scan rate of 52 mm/sec and having a laser spot size of 16 microns. One embodiment includes employing two successive laser scans that expose seven microns of thick positive resist such as AZ-4620. The resist is then developed (removed) in suitable chemistry.

In one embodiment, the adaptive interconnect fabrication process involves applying a first layer of photoresist across the top surfaces of the layered substrate 109 and one or more semiconductor component 105 opening the photoresist with laser exposure and develop (i.e., removal) along the individual, unique path of each required electrical interconnect pattern and depositing a thin seed layer (e.g., 1000 angstroms thick) of conductive metal through sputtering. The seed layer covers at least the exposed area but, in embodiments, the seed layer may cover some or all of the remaining portion of the first layer of photoresist. The adaptive interconnect fabrication process then includes coating the electrical device 100 with a second layer of photoresist, reopening the photoresist with the low energy laser along the individual, unique path of each of the electrical interconnects 125 (i.e., exposing the conductive seed layer) and finally electroplating the conductive seed layer to form the completed electrical interconnects 125 that accommodate for variation in alignment between each electrical conductor 135 and electrical trace 130. Following the electroplating process, the first and second layers of photoresist and any unplated portions of the seed layer applied to the first layer of photoresist are removed from all surfaces of the electrical device 100 surrounding the plated one or more electrical interconnects 125. This process leaves each adaptively patterned electrical interconnect 125 extending between the electrical contact 135 on the semiconductor component 105 and the electrical trace 130 on the layered substrate 109.

In other embodiments, the electrical interconnect 125 may also be formed by directly writing with copper, gold or silver conductor ink. Common RF circuit design tools such as, for example, Agilent® advanced design system and Ansoft® HFSS, may be employed to determine the width of the electrical interconnect 125 for a given thickness of an electrical trace 130. In embodiments, the method of forming the electrical interconnect 125 comprises using a software algorithm to locate the position of fiducials 140 on the semiconductor component relative to fiducials 145 on the first layer 115 and calculating a profile (i.e., width and taper) of the electrical interconnect 125 based on prior knowledge of RF properties provided by the RF circuit design tool. Using a low energy laser to expose and develop out photoresist enables local exposure and localized adaptive patterning for each electrical interconnect 125. This technique accounts for small variations not accounted for in standard wafer mask techniques that treat all traces on a wafer similarly and without consideration to individualized variations in alignment between each electrical contact 135 and electrical trace 130. This technique therefore accommodates variations in alignment between the electrical contacts 135 and electrical traces 130 while providing an effective controlled impedance RF transmission line.

In some illustrative embodiments, the semiconductor component 105 is disposed in the cavity 108 such that the electrical contact 135 on the top surface 107 of the semiconductor component 105 is substantially aligned (along the Z-axis) with the electrical trace 130 on the first layer 115 of the layered substrate 109 prior to formation of the electrical interconnect 125.

Referring to FIG. 3, the trajectory of the electrical interconnect 125 in the X-Y plane is based on the relative positions of at least one fixed fiducial 145 on the first layer 110 and at least one fixed fiducial 140 on the semiconductor component 105. The position of the electrical trace 130 on the first layer 110 is fixed relative to the at least one fixed fiducial 145 on the first layer 110, and the position of the electrical contact 135 on the semiconductor component 105 is fixed relative to the at least one fixed fiducial 140 on the semiconductor component 105.

The electrical device 100 includes a gap 122 between the semiconductor component 105 and walls 111 of the cavity 108. In the illustrative embodiment shown in FIG. 3, the gap 122 is approximately equal between all sides of the device and the adjacent, corresponding walls 111 of the cavity 108. In some embodiments, the gap 122 is between 0-40 microns, and in some illustrative embodiments, the gap 122 between the semiconductor component 105 and the walls 111 of the cavity 108 is between 25-35 microns.

The gap 122 between the semiconductor component 105 and the walls 111 of the cavity 108 is filled with a dielectric material 120 that is a low shrinkage (for example 12% or less), low viscosity material that efficiently fills the gap 122. The dielectric material has a low curing temperature (for example, approximately 200 degrees Celsius). The dielectric material 120 is low loss and has a dielectric constant matching that of the material of the first layer 110. For example, in one embodiment, the dielectric material 120 filling the gap 122 is one of Intervia 8023-10, BCB, or Teflon® and has a dielectric constant of approximately 3.0.

In some embodiments, the dielectric material 120 fills the gap 122 such that a top surface 121 of the dielectric material 120 is substantially coplanar with the top surface 107 of the semiconductor component 105 and the top surface 113 of the first layer 110. In some embodiments, the dielectric material 120 is spin coated across the entire electrical device 100 and selectively removed by photolithography, leaving dielectric material 120 only in the gap 122. The dielectric material 120 in the gap 122 is then cured such that the top surface 121 of the dielectric material 120 is coplanar with the top surface 113 of the first layer 110. The electrical interconnect 125 is formed across the coplanar surfaces of the first layer 110, dielectric material 120 and semiconductor component 105 to achieve a matched impedance between the contact 135 and trace 130. For example, in embodiments, the electrical interconnect 125 could be an impedance transition member of, for example, 50 ohms or 70 ohms, to match the layered substrate 109 electrical characteristics with those of the semiconductor component 105 and create an RF transmission line. In some embodiments, the electrical interconnect 125 has a RF signal loss of between 0 dB and 0.05 dB at 100 GHz, and is 3 to 5 microns thick as measured from top to bottom (i.e., along the Z-axis). The dielectric material 120 therefore eliminates any discontinuity in RF transmission lines associated with existing wire/ribbon bonds and flip chip integration techniques. The dielectric material 120 filling the gap 122 around the semiconductor component 105 eliminates any discontinuity in underlying support structure, and enables a continuous micro-strip interconnection formed by the electrical interconnect 125 adaptively patterned on the semiconductor component 105, first layer 110 and dielectric material 120 between the contact 135 and trace 130.

In some illustrative embodiments, an adhesive is applied to the cavity bottom 106 in dispensable paste or solid film form. Suitable adhesives have a cure temperature less than about 200 degrees Celsius and may comprise any one or more of the following functions: isotropically or anisotropically electrically conducting, electrically insulating, thermally conducting, strongly adhering to noble or non-noble metallizations, moisture resistant, chemically resistant, low outgassing, thermally stable, and flexible or stress absorbing. Suitable adhesives are, for example, one-component, silver or silver alloy-filled pastes and films that are isotropically electrically conducting, thermally conducting, stress absorbing, strongly adhering to gold metallization, and/or which cure at less than about 150 degrees Celsius. Preferred paste adhesives also exhibit viscosity below 60,000 cps at 25 degrees Celsius, a thixotropic index between about 2 and 5, thermal conductivity greater than about 1.5 W-m/K, low resin bleed, high purity, good wetting on gold metallization, shear strength greater than about 17 MPa (2,500 psi) at 25 degrees Celsius, low ionic content, and volume resistivity less than $5 \times 10^{-4}$ ohm-cm. Suitable film adhesives also exhibit preform thickness less than 0.08 mm (0.003 in), thermal conductivity greater than about 1.5 W-m/K, low resin bleed, high purity, good adhesion on gold metallization, shear strength greater than about 17 MPa (2,500 psi) at 25 degrees Celsius, low ionic content, volume resistivity less than $5 \times 10^{-4}$ ohm-cm, and application pressure less than about 103 kPa (15 psi).

In some embodiments, solders are applied to the cavity bottom 106 in a fluxed paste form or as a non-fluxed solid preform. Suitable solder formulations are eutectic and non-eutectic alloys with a liquidus temperature below about 250 degrees Celsius and a solidus temperature above about 150 degrees Celsius. Suitable alloys include tin-lead, lead-free, and specialty (non-tin/lead) formulations, as defined in IPC/EIA J-STD-006, Requirements for Electronic Grade Solder Alloys and Fluxed and Non-Fluxed Solid Solders for Electronic Soldering Applications. Preferred solder alloys have a solidus above about 170 degrees Celsius and a liquidus below about 230 degrees Celsius. Preferred tin-lead formulations include, for example: Sn63Pb37, Sn62Pb36Ag2, Sn70Pb30, Sn90Pb10, Sn50Pb48.5Cu1.5, Sn50Pb50, Sn50Pb50Sb0.4, In20Sn54Pb26, Sn60Pb37.5Bi2.5, Sn60Pb38Cu2, Sn60Pb40, Sn60Pb40Sb0.4, Sn62Pb36AgO2Sb0.4, Sn63Pb37Sb0.4, and Sn70Pb30Sb0.4. Lead-free formulations include, for example: Sn96.3Ag3.7, Sn95.5Ag3.8Cu0.7, Sn95.8Ag3.5Cu0.7, Sn95Ag4Cd1, Sn96Ag2.5Cu0.5Bi1, Sn96.3Ag2.5Cu0.7Sb0.5, Sn96.4Ag3.2Cu0.4, Sn96.5Ag3.5, Sn99.3Cu0.7. Preferred specialty alloys include: In40Pb60, In50Pb50, and In60Pb40.

Figure 4:
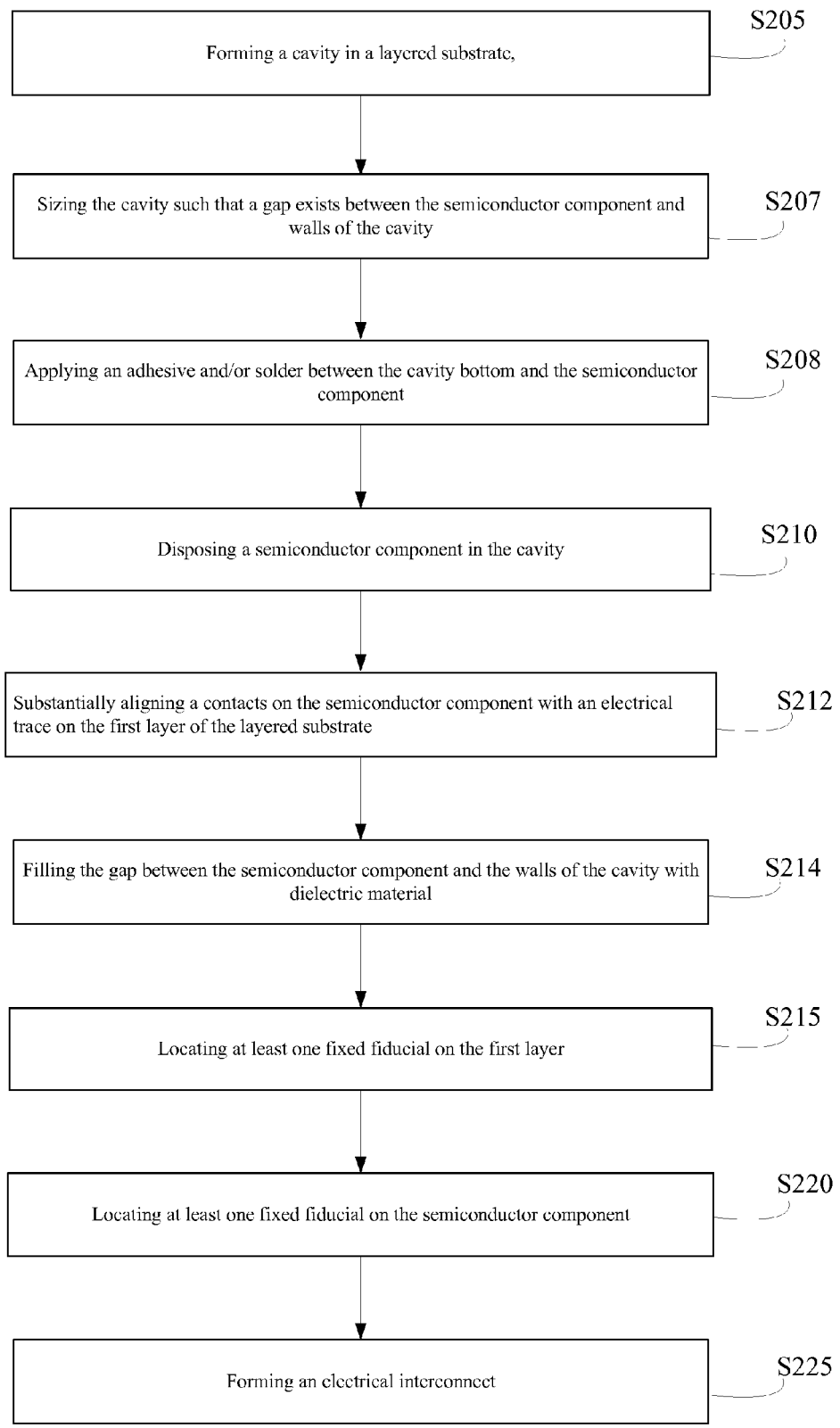
FIG. 4 is a flowchart of a method for integrating a semiconductor component and a substrate, according to an illustrative embodiment.

FIG. 4 is a flowchart of a method for integrating a semiconductor component with a layered substrate to create a high frequency electrical device (e.g., the semiconductor component 105 and layered substrate 109 of the device of FIG. 1). In one embodiment, the method produces a mm-wave frequency electrical device and in another embodiment, the method produces an electrical device that operates at over 100 GHz. As indicated above, the electrical device can include active and passive semiconductor components made of different materials (for example, GaN, GaAs, SiGe and Si), different device technology (for example, p-HEMT, m-HEMT, SOI, CMOS and others) and different thickness that are heterogeneously integrated into the layered substrate.

The method includes forming S205 a cavity in a layered substrate (e.g., cavity 108 in layered substrate 109 of FIG. 1), the layered substrate includes a first layer disposed over a second layer such that the second layer defines the cavity bottom. The method includes disposing S210 a semiconductor component in the cavity such that a top surface of the conductor pad in the semiconductor component is substantially coplanar with the top surface of the conductor trace on the first layer of the layered substrate. In some embodiments, multiple types of semiconductor components, active and passive, and multiple cavities are heterogeneously integrated within the same layered substrate. The method includes locating S215 at least one fixed fiducial on the first layer, and locating S220 at least one fixed fiducial on the semiconductor component. The method includes forming S225 an electrical interconnect between an electrical trace on the first layer and an electrical contact on the semiconductor component based on the relative positions of the at least one fixed fiducial on the first layer and the at least one fixed fiducial on the semiconductor component, wherein the position of the electrical trace on the first layer is fixed relative to the at least one fixed fiducial on the first layer and the position of the electrical contact on the semiconductor component is fixed relative to the at least one fixed fiducial on the semiconductor component. The electrical trace may be formed, for example, by a highly precise conductor direct write process or laser exposure of photoresist, electroplating and etching processes.

In one embodiment, the step of forming S205 the cavity includes sizing S207 the cavity such that a gap exists between the semiconductor component and walls of the cavity. It should be noted that sizing S207 the cavity size can occur prior to forming the cavity in S205. In some embodiments, forming S205 the cavity requires forming portions of the cavity independently in the first layer and second layer of the layered substrate. For example, with regard to the embodiment of FIG. 2, the cavity 108 may be etched in layer 115 and then the cavity formed in layer 110 after it is deposited on layer 115.

In one embodiment, the gap between the semiconductor component and the walls of the cavity is 0-40 microns. In another embodiment, the gap between the semiconductor component and the walls of the cavity is 25-35 microns. In one embodiment, the method further includes filling S214 the gap between the semiconductor component and the walls of the cavity with dielectric material such that a top surface of a trace on the dielectric material is substantially coplanar with the top surface of a contact on the semiconductor component and the top surface of the first layer. In some embodiments, the method includes applying S208 an adhesive between the cavity bottom and the semiconductor component, and in other embodiments, the method includes applying S208 solder between the cavity bottom and the semiconductor component.

Returning to the step of forming S225 an electrical interconnect between the electrical trace and the electrical contact, the method includes adaptively patterning the electrical interconnect onto the coplanar top surfaces of the first layer, dielectric fill and semiconductor component such that impedance is matched between the components and a low loss, high frequency RF transmission line is formed over a continuous solid surface of low dielectric constant. In embodiments, the electrical interconnect has a RF signal loss of only between 0 dB and 0.05 dB at 100 GHz. In one embodiment, the electrical interconnect is patterned on the electrical device using local laser exposure of photoresist and electroplating techniques, and in other embodiments, the electrical interconnect is dispensed using a pen, a stamping process, or a direct write process that direct writes conductors made of gold, silver, or copper.

In embodiments, the method employs using a patterning tool for locating S215 the at least one fixed fiducial on the semiconductor component and locating S220 at least one fixed fiducial on the first layer. In some embodiments, prior to disposing the semiconductor component into the cavity, the method includes substantially aligning S212 the contacts on the semiconductor component with an electrical trace on the first layer of the layered substrate. This further improves the accuracy and efficiency of forming 225 the electrical interconnect.

The tool employs a software means that adjusts the pattern of the electrical interconnect to achieve proper impedance matching while compensating for any variation in interconnect length between contacts on the semiconductor component and corresponding network traces on the first layer of the layered substrate. The embodiments include stretching, compressing, translating and/or rotating the pattern for the electrical interconnect as needed to accommodate the variation in placement of the semiconductor component within the cavity and relative to the traces on the layered substrate and obtaining optimum high frequency electrical performance (i.e., performance with little to no RF loss, such as 0 dB to 0.05 dB at 100 GHz). For example, adjusting the pattern can include translating the location of the electrical interconnect in the X-Y plane and/or stretching the electrical interconnect to increase length and/or width to connect the contacts and traces and match impedance between those elements. The method therefore accommodates placement variation of the semiconductor component while matching impedances between the contacts and traces to ensure minimal or no RF loss at high operational frequencies. Once the software has adjusted the pattern for the electrical interconnect, the patterning tool patterns the electrical interconnect to fit the actual transition between the contact and trace. The method therefore integrates semiconductor components through ultra low loss adaptive electrical interconnections by recognizing the location of a semiconductor component and patterning a high precision conductor (i.e., electrical interconnect) between the semiconductor component and a network trace formed on the layered substrate.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

The invention claimed is:

1. A method of integrating a semiconductor component with a layered substrate comprising:
   forming a cavity in a layered substrate, the layered substrate includes a first dielectric layer disposed over a second grounding layer of the layered substrate such that the second grounding layer defines the cavity bottom;
   disposing at least one electrical trace on a top surface of the first dielectric layer;
   disposing a semiconductor component in the cavity such that a top surface of at least one electrical contact on the semiconductor component is substantially coplanar with a top surface of the at least one electrical trace on the first dielectric layer of the layered substrate;
   forming a gap between the semiconductor component and the at least one cavity formed in the first dielectric layer of the layered substrate;
   disposing a gap fill material in said gap such that a top surface of the gap fill material is substantially coplanar with a top surface of the semiconductor component and a top surface of the first dielectric layer;
   disposing an electrical interconnect across the top surface of the dielectric gap fill material and between the at least one electrical contact on the semiconductor component and the at least one electrical trace on the first dielectric layer; and
   wherein dielectric properties of the dielectric gap fill material substantially match the dielectric properties of the first dielectric layer, the dielectric gap fill material thereby providing a continuous, low loss, micro-strip interconnection between the semiconductor component and the first dielectric layer, the interconnection providing no discontinuity in dielectric properties across the gap between the semiconductor component and the first dielectric layer.

2. The method of claim 1, wherein the step of forming the cavity comprises sizing the cavity such that the gap exists between the semiconductor component and walls of the cavity.

3. The method of claim 2, wherein the gap between the semiconductor component and the walls of the cavity is 0-40 microns.

4. The method of claim 3, wherein the gap between the semiconductor component and the walls of the cavity is 25-35 microns.

5. The method of claim 1, further comprising applying an adhesive between the cavity bottom and the semiconductor component.

6. The method of claim 1, further comprising applying solder between the cavity bottom and the semiconductor component.

7. The method of claim 1, wherein the first layer is a liquid crystal polymer (LCP) material.

8. The method of claim 1, wherein the integrated semiconductor component and substrate is a monolithic microwave integrated circuit comprising one or more FETs and one or more passive components.

9. The method of claim 1, wherein the second layer is manufactured from a thermally dissipative material such as Cu.

10. The method of claim 1, wherein the integrated semiconductor component and substrate form a mm-wave frequency device.

11. The method of claim 1, wherein the electrical interconnect is a controlled impedance transition member.

12. The method of claim 1, wherein the electrical interconnect is an RF transmission line.

13. The method of claim 1, wherein the electrical interconnect has an RF signal loss of between 0dB and 0.05dB at 100 GHz.

14. The method of claim 1, wherein the electrical interconnect is 3 to 5 microns thick.

15. The method of claim 1, wherein the top surface of the second dielectric layer defines the cavity bottom.

16. The method of claim 1, wherein an internal portion of the second dielectric layer defines the cavity bottom.

17. The method of claim 1, wherein the semiconductor component is disposed in the cavity such that the electrical contact on the top surface of the semiconductor component is substantially aligned with the electrical trace on the first dielectric layer of the layered substrate, wherein alignment includes locating the relative positions of the at least one fixed fiducial on the first dielectric layer and the at least one fixed fiducial on the semiconductor component.

18. The method of claim 1, further comprising patterning the electrical interconnect to compensate for variation in electrical interconnect length between one or more contacts on the semiconductor component and one or more corresponding electrical traces on the first dielectric layer of the layered substrate.

19. The method of claim 18, further comprising at least one of stretching, compressing, translating or rotating the electrical interconnect pattern to accommodate for variation in placement of the semiconductor component within the cavity.

20. The method of claim 18, further comprising forming the electrical interconnect using one of a pen, a stamping process, or a direct write process that direct writes conductors made of gold, silver, or copper.

21. The method of claim 18, further comprising locally developing a photoresist with a laser to adaptively pattern each individual electrical interconnect extending between one of the one or more contacts and a corresponding one of the one or more electrical traces, thereby accommodating misalignment.

22. The method of claim 21, wherein the laser is a 355 nm laser producing 3.5 mw of power at a laser firing frequency of 30 KHz with a linear scan rate of 52 mm/sec and having a laser spot size of 16 microns.

23. The method of claim 18, further comprising:
a) coating a first layer of photoresist across the top surfaces of the first dielectric layer and semiconductor component;
b) opening the first layer of photoresist with laser exposure and development along the electrical interconnect pattern;
c) depositing a conductive seed layer at least along the electrical interconnect pattern opened in the first layer of photoresist;
d) coating a second layer of photoresist across the top surfaces of the first dielectric layer, semiconductor component, and seed layer;
e) opening the second layer of photoresist with laser exposure and development along the electrical interconnect pattern;
f) electroplating the seed layer along the electrical interconnect pattern; and
g) removing the first layer of photoresist, second layer of photoresist and unplated seed layer disposed there between if present.

24. The method of claim 23, wherein the laser is a 355 nm laser producing 3.5 mw of power at a laser firing frequency of 30 KHz with a linear scan rate of 52 mm/sec and having a laser spot size of 16 microns.

25. An electrical device comprising:
a layered substrate comprising a first dielectric layer disposed over a second grounding layer of the layered substrate;
at least one cavity formed in the first dielectric layer of the layered substrate such that the second grounding layer defines the cavity bottom;
at least one electrical trace disposed on a top surface of the first dielectric layer;
a semiconductor component disposed in the at least one cavity such that a top surface of at least one electrical contact on the semiconductor component is substantially coplanar with a top surface of the at least one electrical trace on the first dielectric layer of the layered substrate;
a gap formed between the semiconductor component and the at least one cavity formed in the first dielectric layer of the layered substrate;
a dielectric gap fill material disposed in said gap such that a top surface of the gap fill material is substantially coplanar with a top surface of the semiconductor component and a top surface of the first dielectric layer;
an electrical interconnect disposed across the top surface of the dielectric gap fill material and between the at least one electrical contact on the semiconductor component and the at least one electrical trace on the first dielectric layer;
wherein dielectric properties of the dielectric gap fill material substantially match the dielectric properties of the first dielectric layer, the dielectric gap fill material thereby providing a continuous, low loss, micro-strip interconnection between the semiconductor component and the first dielectric layer, the interconnection providing no discontinuity in dielectric properties across the gap between the semiconductor component and the first dielectric layer.

26. The electrical device of claim 25, wherein the gap between the semiconductor component and the walls of the at least one cavity is 0-40 microns.

27. The electrical device of claim 25, wherein the gap between the semiconductor component and the walls of the at least one cavity is 25-35 microns.

28. The electrical device of claim 25, wherein the electrical device is a monolithic microwave integrated circuit comprising one or more FETs and one or more passive components.

29. The electrical device of claim 25, wherein the electrical device is a mm-wave frequency device.

30. The electrical device of claim 25, wherein the semiconductor component is disposed in the at least one cavity such that the electrical contact on the top surface of the semiconductor component is substantially aligned with the at least one electrical trace on the first dielectric layer of the layered substrate, wherein alignment includes locating the relative positions of at least one fixed fiducial on the first dielectric layer and at least one fixed fiducial on the semiconductor component.

31. The electrical device of claim 25 wherein the at least one electrical trace is an RF transmission line with controlled impedance and wherein the electrical interconnect is patterned to compensate for variation in electrical interconnect length and alignment, the patterned electrical interconnect providing a matched RF impedance interconnect between at least one contact on the semiconductor component and at least one corresponding RF transmission line on the first layer of the layered substrate.

32. An electrical device comprising:
   a layered substrate comprising a first dielectric layer disposed over a second grounding layer of the layered substrate;
   at least one cavity formed in the first dielectric layer of the layered substrate such that the second grounding layer defines the cavity bottom;
   at least one electrical trace disposed on a top surface of the first dielectric layer;
   a semiconductor component disposed in the at least one cavity such that a top surface of at least one electrical contact on the semiconductor component is substantially coplanar with a top surface of the at least one electrical trace on the first dielectric layer of the layered substrate;
   a gap formed between the semiconductor component and the at least one cavity formed in the first dielectric layer of the layered substrate;
   a dielectric gap fill material disposed in said gap such that a top surface of the gap fill material is substantially coplanar with a top surface of the semiconductor component and a top surface of the first dielectric layer; and
   an electrical interconnect disposed across the top surface of the dielectric gap fill material and between the at least one electrical contact on the semiconductor component and the at least one electrical trace on the first dielectric layer, wherein the at least one electrical trace is an RF transmission line with controlled impedance and wherein the electrical interconnect is patterned to compensate for variation in electrical interconnect length and alignment, the patterned electrical interconnect providing a matched RF impedance interconnect between at least one contact on the semiconductor component and at least one corresponding RF transmission line on the first layer of the layered substrate.

33. The electrical device of claim 32, wherein the gap between the semiconductor component and the walls of the at least one cavity is 0-40 microns.

34. The electrical device of claim 32, wherein the gap between the semiconductor component and the walls of the at least one cavity is 25-35 microns.

35. The electrical device of claim 32, wherein the electrical device is a monolithic microwave integrated circuit comprising one or more FETs and one or more passive components.

36. The electrical device of claim 32, wherein the electrical device is a mm-wave frequency device.

37. The electrical device of claim 32, wherein the semiconductor component is disposed in the at least one cavity such that the electrical contact on the top surface of the semiconductor component is substantially aligned with the at least one electrical trace on the first dielectric layer of the layered substrate, wherein alignment includes locating the relative positions of at least one fixed fiducial on the first dielectric layer and at least one fixed fiducial on the semiconductor component.

38. The electrical device of claim 32 wherein dielectric properties of the dielectric gap fill material substantially match the dielectric properties of the first dielectric layer, the dielectric gap fill material thereby providing a continuous, low loss, micro-strip interconnection between the semiconductor component and the first dielectric layer, the interconnection providing no discontinuity in dielectric properties across the gap between the semiconductor component and the first dielectric layer.

39. A method of integrating a semiconductor component with a layered substrate comprising:
   forming a cavity in a layered substrate, the layered substrate includes a first dielectric layer disposed over a second grounding layer of the layered substrate such that the second grounding layer defines the cavity bottom;
   disposing at least one electrical trace on a top surface of the first dielectric layer;
   disposing a semiconductor component in the cavity such that a top surface of at least one electrical contact on the semiconductor component is substantially coplanar with a top surface of the at least one electrical trace on the first dielectric layer of the layered substrate;
   forming a gap between the semiconductor component and the at least one cavity formed in the first dielectric layer of the layered substrate;
   disposing a gap fill material in said gap such that a top surface of the gap fill material is substantially coplanar with a top surface of the semiconductor component and a top surface of the first dielectric layer; and
   disposing an electrical interconnect across the top surface of the dielectric gap fill material and between the at least one electrical contact on the semiconductor component and the at least one electrical trace on the first dielectric layer, wherein the at least one electrical trace is an RF transmission line with controlled impedance and wherein the electrical interconnect is patterned to compensate for variation in electrical interconnect length and alignment, the patterned electrical interconnect providing a matched RF impedance interconnect between at least one contact on the semiconductor component and at least one corresponding RF transmission line on the first layer of the layered substrate.

* * * * *